United States Patent
Lee et al.

(10) Patent No.: US 9,436,568 B2
(45) Date of Patent: Sep. 6, 2016

(54) SIMPLIFIED PASSENGER SERVICE UNIT (SPSU) TESTER

(71) Applicant: THE BOEING COMPANY, Chicago, IL (US)

(72) Inventors: Donald B. Lee, Chicago, IL (US); Yakentim M. Ibrahim, Chicago, IL (US)

(73) Assignee: THE BOEING COMPANY, Chicago, IL (US)

( * ) Notice: Subject to any disclaimer, the term of this patent is extended or adjusted under 35 U.S.C. 154(b) by 86 days.

(21) Appl. No.: 14/296,259

(22) Filed: Jun. 4, 2014

(65) Prior Publication Data
US 2015/0355988 A1 Dec. 10, 2015

(51) Int. Cl.
*G06F 11/273* (2006.01)
*B64D 11/00* (2006.01)
*G01R 31/00* (2006.01)
*G06F 13/38* (2006.01)

(52) U.S. Cl.
CPC ........... *G06F 11/273* (2013.01); *G01R 31/008* (2013.01); *G06F 13/385* (2013.01)

(58) Field of Classification Search
CPC .. B64D 11/00; B64D 11/0015; B64D 47/02; G06F 1/1632; G07C 5/0808; B60R 16/03; H02G 3/32
USPC ........... 701/3, 33, 31.4, 33.9, 33.2; 713/300; 714/27; 725/75; 315/77; 244/118.5; 370/242
See application file for complete search history.

(56) References Cited

U.S. PATENT DOCUMENTS

| | | | | |
|---|---|---|---|---|
| 3,795,771 A | * | 3/1974 | Gundersen | B64D 11/00 340/4.37 |
| 6,393,343 B1 | * | 5/2002 | Frey | B64D 11/00 244/118.5 |
| 7,597,286 B2 | * | 10/2009 | Callahan | H02G 3/32 244/118.5 |
| 8,128,027 B2 | | 3/2012 | Lee | |
| 8,245,969 B2 | | 8/2012 | Lee | |
| 8,385,339 B1 | | 2/2013 | Ibrahim | |
| 2006/0005055 A1 | * | 1/2006 | Potega | G06F 1/1632 713/300 |
| 2008/0040756 A1 | * | 2/2008 | Perlman | B64D 11/0015 725/75 |
| 2010/0023198 A1 | * | 1/2010 | Hamilton | B60R 16/03 701/31.4 |
| 2010/0109530 A1 | * | 5/2010 | Eckel | B64D 47/02 315/77 |
| 2014/0163814 A1 | * | 6/2014 | Rousu | G07C 5/0808 701/33.9 |

FOREIGN PATENT DOCUMENTS

| | | |
|---|---|---|
| WO | 2012166591 A1 | 12/2012 |
| WO | 2013104762 A1 | 7/2013 |

OTHER PUBLICATIONS

Extended European Search Report, Patent Application No. 15170375.8-1954, Sep. 24, 2015.

* cited by examiner

*Primary Examiner* — Yuri Kan
(74) *Attorney, Agent, or Firm* — Vista IP Law Group LLP; Cynthia A. Dixon

(57) ABSTRACT

Systems, methods, and apparatus for testing a passenger service unit (PSU) of a cabin of a vehicle are disclosed. In one or more embodiments, the disclosed method involves installing a test interface panel (TIP) in the cabin of the vehicle such that the TIP is connected to a power source and is able to communicate with the PSU. The method further involves connecting a user interface to the TIP. Also, the method involves sending at least one command, from the user interface, to the PSU via the TIP. Further, the method involves sending, at least one response, from the PSU.

20 Claims, 11 Drawing Sheets

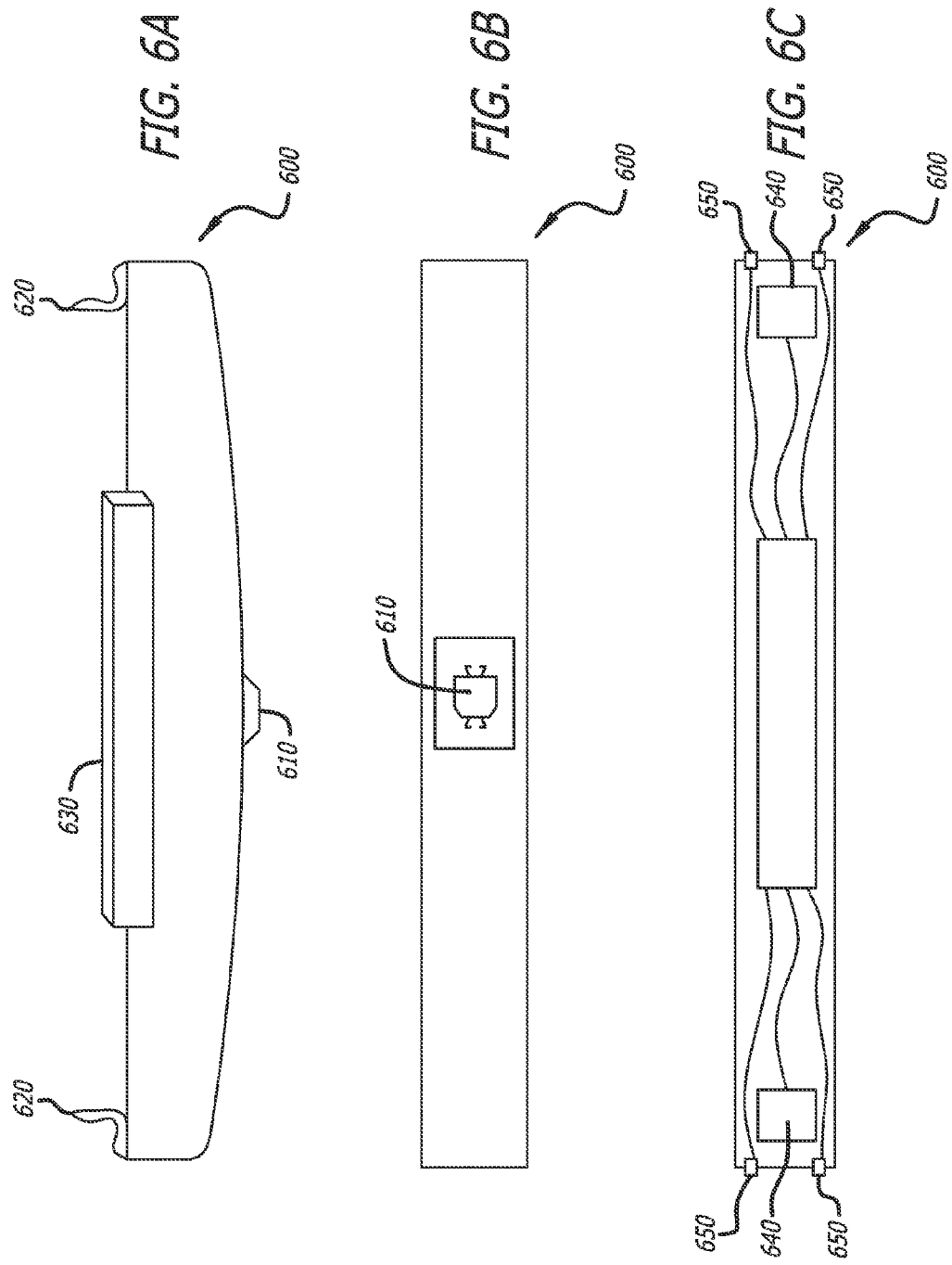

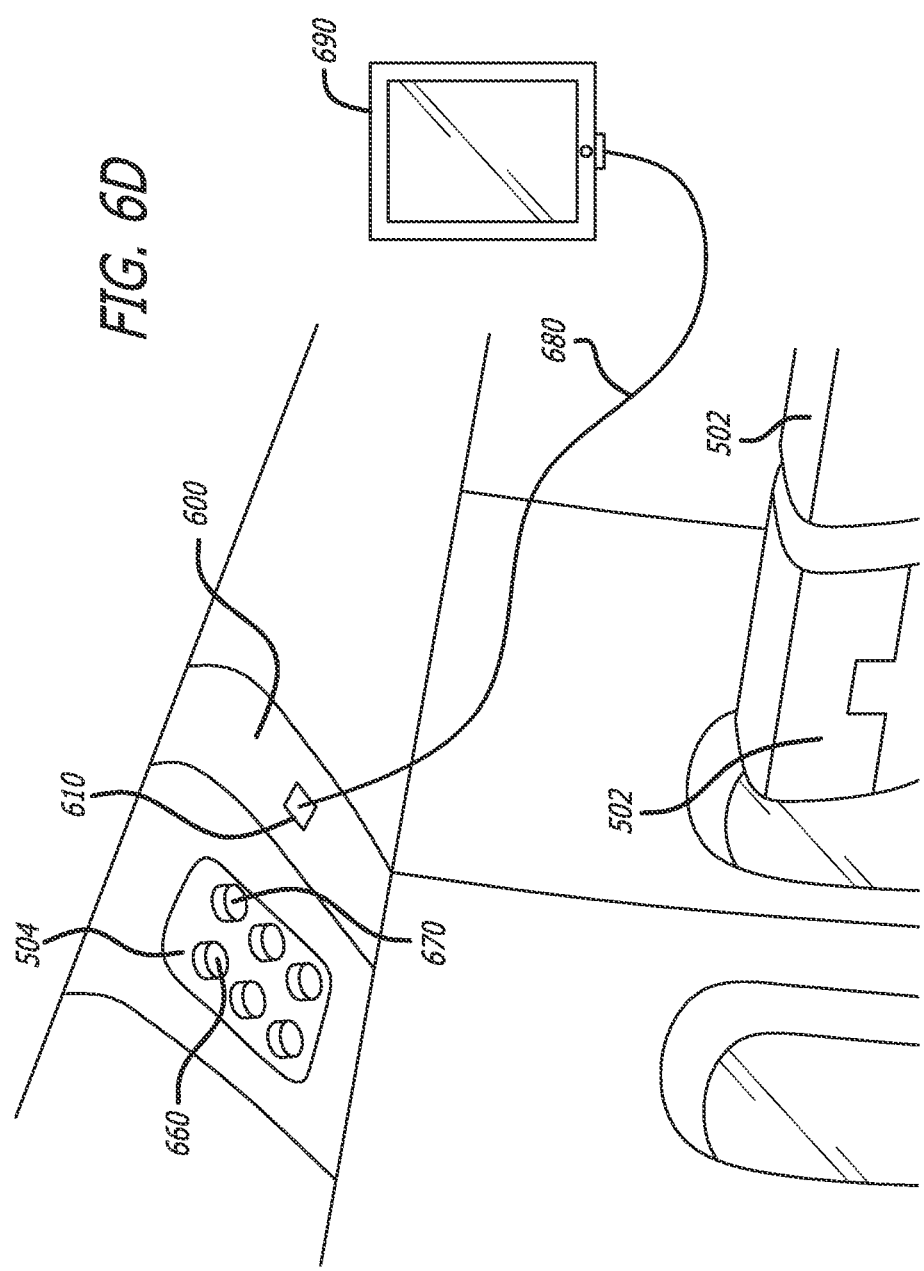

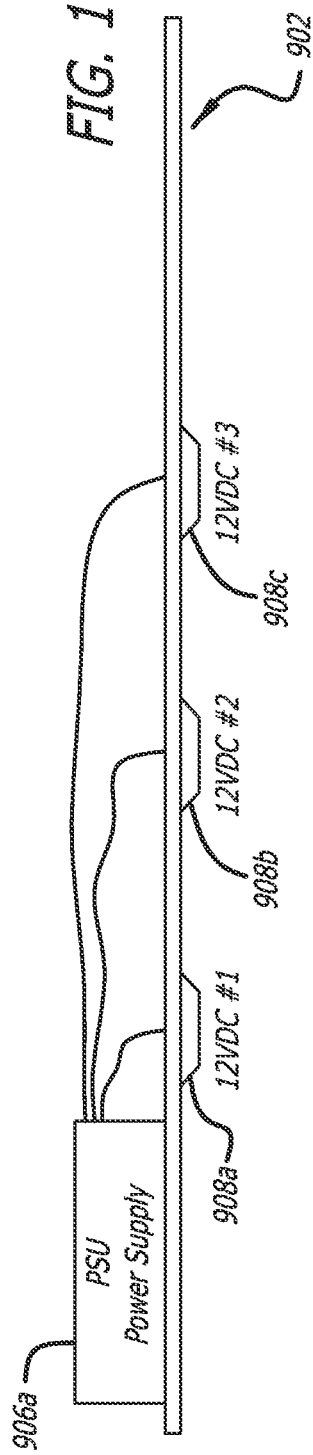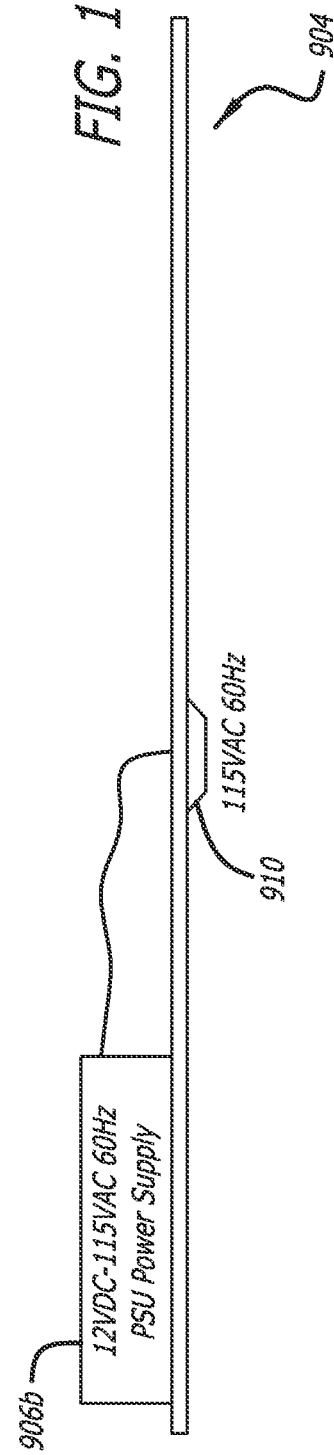

SIMPLIFIED PASSENGER SERVICE UNIT (SPSU) TESTER

CROSS-REFERENCE TO RELATED APPLICATIONS

This application is related to U.S. Pat. No. 8,385,339, issued Feb. 26, 2013; U.S. Pat. No. 8,245,969, issued Aug. 21, 2012; U.S. Pat. No. 8,128,027, issued Mar. 6, 2012; and U.S. Pat. No. 7,597,286, issued Oct. 6, 2009, which are all hereby incorporated by reference in their entirety.

FIELD

The present disclosure relates to simplified passenger service units. In particular, it relates to simplified passenger service unit (SPSU) testers.

BACKGROUND

Airplanes employ passenger service units (PSUs) in the cabin that are each associated with at least one passenger seat. The PSUs are typically installed as panels above their associated seat(s). The PSUs are used to provide services to the passengers sitting in their associated seats. Services that the PSUs may provide include, but are not limited to, reading light function, an attendant calling function, ventilation, oxygen, in-flight entertainment, notification signage, and internet connectivity.

One type of PSU currently employed by some airplanes is called a simplified passenger service unit (SPSU). The SPSU design is a simplified design that allows for each SPSU panel to be directly and easily connected into a power rail, which runs above the panels, for power. The SPSUs communicate their functions to a computer system via infrared (IR), radio frequency (RF), and/or electrical cable (e.g., RS-485).

Currently, SPSU architecture does not allow for easy access to the communication data buses (e.g., the IR or RS-485 buses) without removal of the SPSU panels themselves. With the IR bus configuration, removal of the SPSU panels can interrupt the panel communication, introduce obstructions or reflections into the IR path, and generate additional confusion during airplane installation and system testing. As such, there is a need for a test design that allows for the SPSU panels to be tested without requiring removal of the SPSU panels.

SUMMARY

The present disclosure relates to a method, system, and apparatus for a simplified passenger service unit (SPSU) tester. In one or more embodiments, a method for testing a passenger service unit (PSU) of a cabin of a vehicle involves installing a test interface panel (TIP) in the cabin of the vehicle such that the TIP is connected to a power source and is able to communicate with the PSU. The method further involves connecting a user interface to the TIP. Also, the method involves sending at least one command, from the user interface, to the PSU via the TIP. Further, the method involves sending, at least one response, from the PSU.

In one or more embodiments, the vehicle is an airborne vehicle, a terrestrial vehicle, or a marine vehicle. In at least one embodiment, the airborne vehicle is an aircraft or a spacecraft. In some embodiments, the terrestrial vehicle is a bus or a train. In one or more embodiments, the marine vehicle is a boat or a ship.

In at least one embodiment, the PSU controls a reading light, an attendant calling function, ventilation, oxygen, an in-flight entertainment system, notification signage, and/or internet connectivity. In some embodiments, the TIP is connected to the power source via a power rail in the cabin. In one or more embodiments, the TIP is able to communicate with the PSU by infrared (IR), radio frequency (RF), or electrical cable. In some embodiments, the user interface is connected to the TIP by wire or wirelessly.

In one or more embodiments, the user interface is a tablet computer, a laptop computer, or a smart phone. In some embodiments, at least one command is a test command or a configuration command. In at least one embodiment, the test command is a verification command or a troubleshooting command. In one or more embodiments, at least one response is a signal response received by the user interface from the PSU via the TIP and/or a physical response.

In at least one embodiment, a system for testing a passenger service unit (PSU) of a cabin of a vehicle involves a test interface panel (TIP) installed in the cabin of the vehicle such that the TIP is connected to a power source and is able to communicate with the PSU. The system further involves a user interface to connect to the TIP and to send at least one command to the PSU via the TIP. Further, the system involves the PSU to send at least one response.

In one or more embodiments, the TIP is connected to the power source via a power rail in the cabin. In some embodiments, the TIP is able to communicate with the PSU by infrared (IR), radio frequency (RF), or electrical cable. In at least one embodiment, the user interface is connected to the TIP by wire or wirelessly.

In at least one embodiment, the user interface is a tablet computer, a laptop computer, or a smart phone. In some embodiments, at least one response is a signal response received by the user interface from the PSU via the TIP and/or a physical response.

In one or more embodiments, an apparatus for testing a passenger service unit (PSU) of a cabin of a vehicle involves a test interface panel (TIP). In one or more embodiments, the TIP is installed in the cabin of the vehicle such that the TIP is connected to a power source and is able to communicate with the PSU. In at least one embodiment, the TIP is to connect to a user interface, to receive at least one command from the user interface, and to send the at least one command to the PSU.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

FIG. 6A is a side view of a disclosed test interface panel, in accordance with at least one embodiment of the present disclosure.

FIG. 6B is a front view of the test interface panel of FIG. 6A, in accordance with at least one embodiment of the present disclosure.

FIG. 6C is a back view of the test interface panel of FIG. 6A, in accordance with at least one embodiment of the present disclosure.

FIG. 6D is an illustration of a passenger service unit being tested by a user interface via the test interface panel of FIGS. 6A-C in an aircraft cabin, in accordance with at least one embodiment of the present disclosure.

FIG. 10A is a detailed view of the power module unit of FIG. 9B, in accordance with at least one embodiment of the present disclosure.

FIG. 10B is a detailed view of the power module of FIG. 9C, in accordance with at least one embodiment of the present disclosure.

DESCRIPTION

Figure 1:
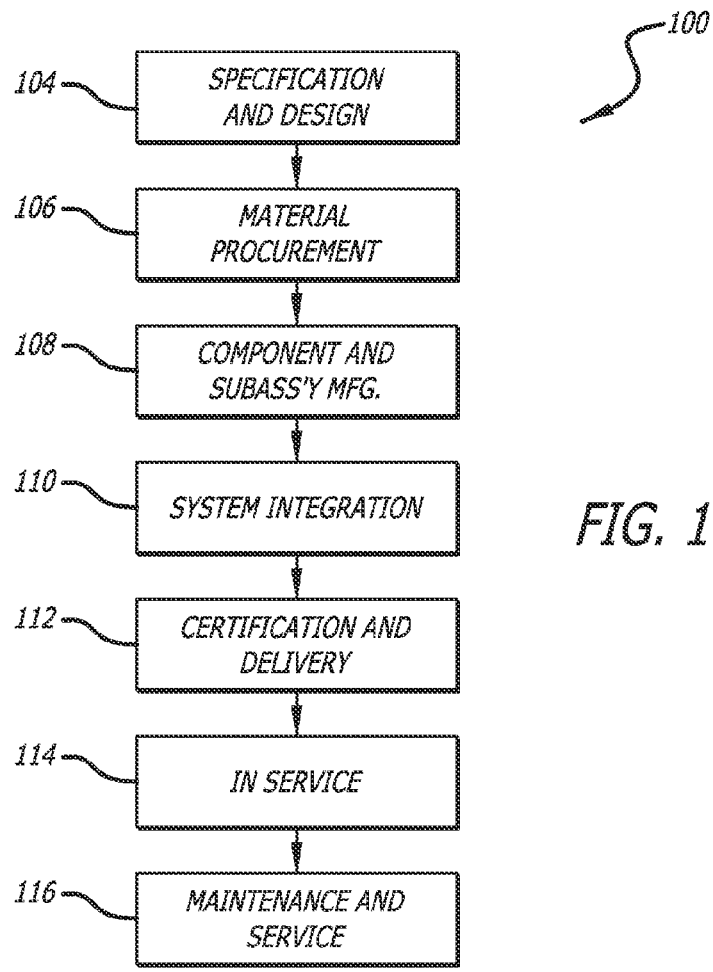
FIG. 1 is an illustration of an aircraft manufacturing and service method in which an advantageous embodiment may be implemented, in accordance with at least one embodiment of the present disclosure.

The methods and apparatus disclosed herein provide an operative system for a simplified passenger service unit (SPSU) tester. The disclosed system provides a SPSU test design that allows for the SPSU panels to be tested without requiring removal of the SPSU panels.

As previously mentioned above, airplanes employ passenger service units (PSUs) in the cabin that are each associated with at least one passenger seat. The PSUs are typically installed as panels above their associated seat(s). The PSUs are used to provide services to the passengers sitting in their associated seats. Services that the PSUs may provide include, but are not limited to, reading light function, an attendant calling function, ventilation, oxygen, in-flight entertainment, notification signage, and internet connectivity.

One type of PSU currently employed by some airplanes is called a simplified passenger service unit (SPSU). The SPSU design is a simplified design that allows for each SPSU panel to be directly and easily connected into a power rail, which runs above the panels, for power. The SPSUs communicate their functions to a computer system via infrared (IR), radio frequency (RF), and/or electrical cable (e.g., RS-485). It should be noted that the type of passenger service units (PSUs) discussed in the detailed description of the figures are SPSUs.

Currently, SPSU architecture does not allow for easy access to the communication data buses (e.g., the IR or RS-485 buses) without removal of the SPSU panels themselves. With the IR bus configuration, removal of the SPSU panels can interrupt the panel communication, introduce obstructions or reflections into the IR path, and generate additional confusion during airplane installation and system testing.

The disclosed design of the present disclosure is a new system tester for simplified passenger service unit (SPSU) vehicle installations. Part of the problem when troubleshooting new installations of SPSUs is determining the health of the power rail and the IR and RS-485 data buses. Additionally, when testing and troubleshooting new SPSU panel designs, there is a need to "creatively fail" or corrupt the data stream at a data bit level. The disclosed SPSU tester of the present disclosure can interface with the SPSU panels through a special blank panel (i.e. a test interface panel (TIP)) that can be inserted on the power rail between the SPSU panels to provide complete access to the data bus and power bus for active testing and modification. A software utility resides on a standard laptop or tablet computer giving the user direct visibility and access to the power bus and data bus, as well as the ability to change the bus data in real-time at the bit level.

The SPSU test interface panel and laptop resident test software provide a means to be able to monitor, probe, test, and change data in real time on either the IR or RS-485 data buses at the bit level, along with monitoring the health and condition of the IR or RS-485 data buses as well as the power rail voltages and state.

The disclosed SPSU tester design allows for troubleshooting to be performed directly at the offending location in the cabin of the airplane and allows for detailed testing to be performed where the technician is actually working (e.g., near the SPSU panel being tested) on the airplane.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Embodiments of the invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present invention may be practiced in conjunction with a variety of different configurations, and that the system described herein is merely one example embodiment of the invention. Thus, although the schematic representations shown in the figures depict example arrangements of elements, additional intervening elements, devices, features, or components may be present in an embodiment of the invention.

Figure 2:
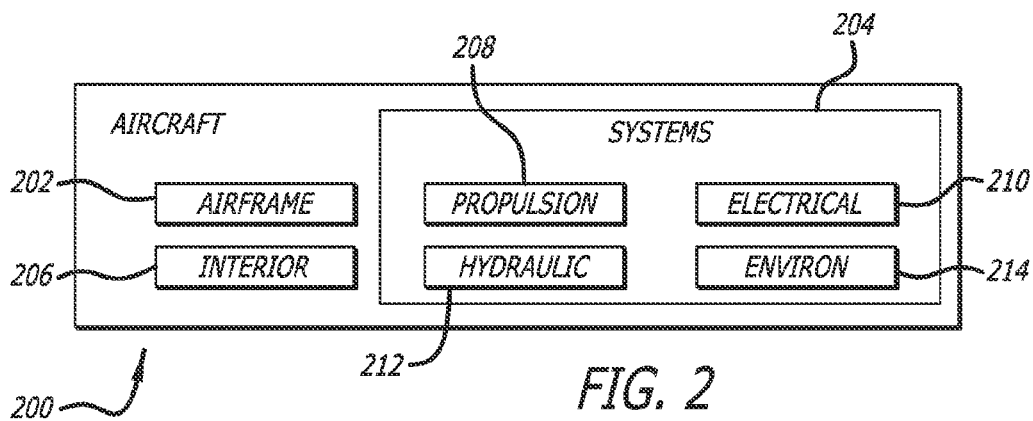
FIG. 2 is an illustration of an aircraft depicted in accordance with at least one embodiment of the present disclosure.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

In some advantageous embodiments, components are installed aboard the aircraft during system integration 108. The components include any combination of a number of computer systems, a number of transceiver units, a number of network media or other suitable components. Installing the components comprises positioning the components in advantageous locations aboard the aircraft. For example, the components may be installed such that a computer system is located at the front of a column of passenger seats, a computer system is located behind the column of passenger seats, and a transceiver unit is located above each row of passenger seats in the column.

In other advantageous embodiments, components are installed aboard the aircraft during maintenance and service 114. In such advantageous embodiments, panels in the cabin may be moved, added, replaced, or removed. During maintenance and service 114, wiring may be removed from the aircraft in order to reduce the weight of the aircraft. Panels with wireless communication links may be installed to replace the wiring. Installing the panels with wireless communication links avoids the cost and time of installing and moving additional wiring in future passenger seating changes.

In these examples, "a number of" an item means one or more of the item. For example, "a number of transceiver units" means one or more transceiver units.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, and environmental system 214. Any number of other systems may be included. Although an aerospace example is shown, different advantageous embodiments may be applied to other industries, such as the automotive industry.

Systems and methods embodied herein may be employed during at least one of the stages of aircraft manufacturing and service method 100 in FIG. 1. As described, some advantageous embodiments may be installed, configured, maintained, replaced, and/or removed during component and subassembly manufacturing 106. However, other advantageous embodiments may be installed, configured, maintained, replaced, and/or removed during a number of other stages in aircraft manufacturing and service method 100.

Additionally, components of the system and methods embodied herein may be installed, configured, maintained, and/or replaced in interior 206 and/or removed from interior 206. However, the components may also be located in other portions of aircraft 200.

As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of system embodiments, method embodiments, or a combination thereof may be utilized during production stages, such as component and subassembly manufacturing 106 and system integration 108 in FIG. 1. A number, when referring to items, means "one or more items". For example, a "number of system embodiments" is one or more system embodiments. A number of system embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

Figure 3:
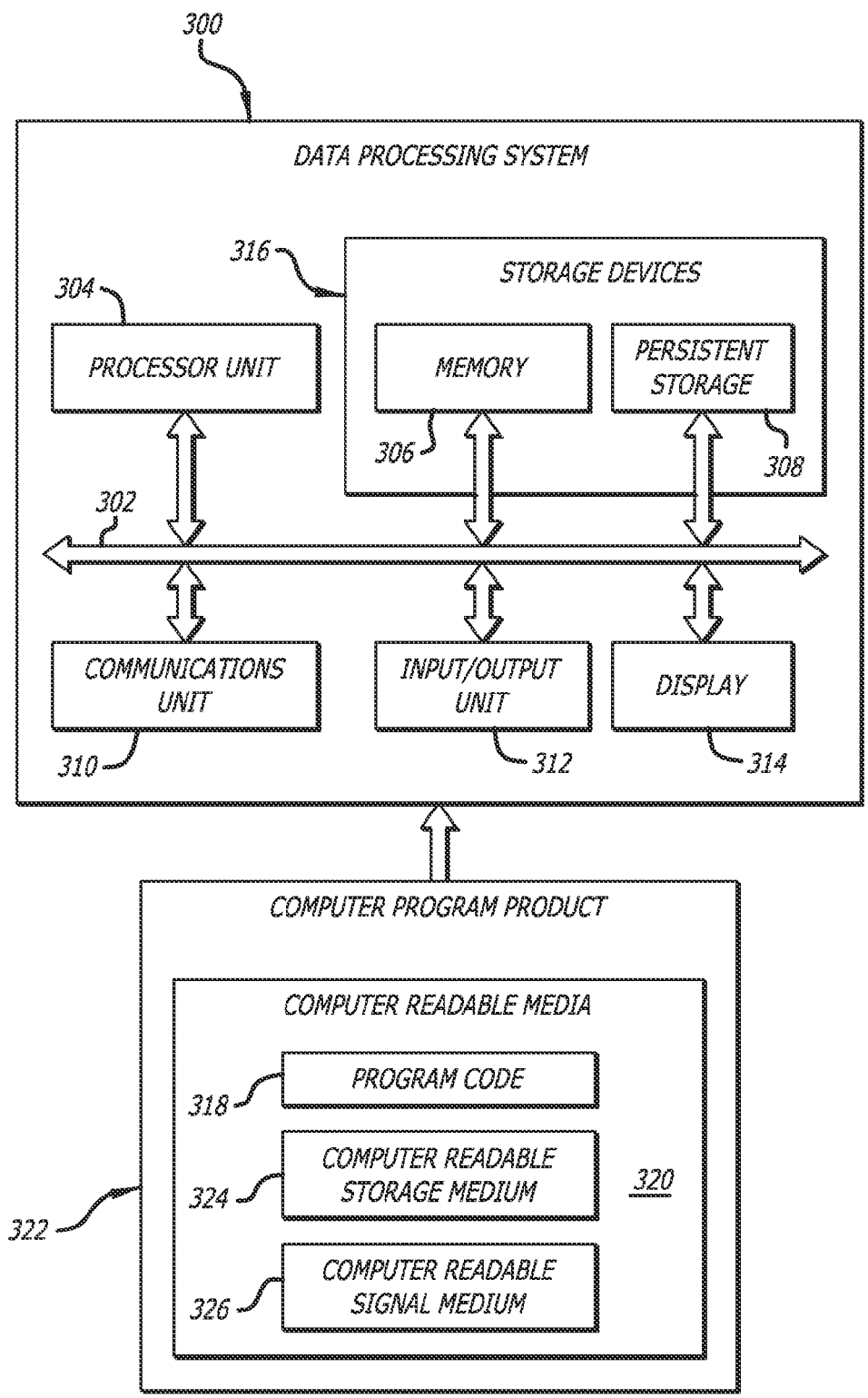
FIG. 3 is an illustration of a block diagram of a data processing system depicted in accordance with at least one embodiment of the present disclosure.

Turning now to FIG. 3, an illustration of a diagram of a data processing system is depicted in accordance with an illustrative embodiment. In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a number of processors, may be a multi-processor core, or some other type of processor, depending on the particular implementation. A number, as used herein with reference to an item, means one or more items. Further, processor unit 304 may be implemented using a number of heterogeneous processor systems in which a main processor is present with secondary processors on a single chip. As another illustrative example, processor unit 304 may be a symmetric multi-processor system containing multiple processors of the same type.

Memory 306 and persistent storage 308 are examples of storage devices 316. A storage device is any piece of hardware that is capable of storing information, such as, for example, without limitation, data, program code in functional form, and/or other suitable information either on a temporary basis and/or a permanent basis. Memory 306, in these examples, may be, for example, a random access memory or any other suitable volatile or non-volatile storage device. Persistent storage 308 may take various forms depending on the particular implementation. For example, persistent storage 308 may contain one or more components or devices. For example, persistent storage 308 may be a hard drive, a flash memory, a rewritable optical disk, a rewritable magnetic tape, or some combination of the above. The media used by persistent storage 308 also may be removable. For example, a removable hard drive may be used for persistent storage 308.

Communications unit 310, in these examples, provides communications with other data processing systems or devices. In these examples, communications unit 310 is a network interface card. Communications unit 310 may provide communications through the use of either or both physical and wireless communications links.

Input/output unit 312 allows for input and output of data with other devices that may be connected to data processing system 300. For example, input/output unit 312 may provide a connection for user input through a keyboard, a mouse, and/or some other suitable input device. Further, input/output unit 312 may send output to a printer. Display 314 provides a mechanism to display information to a user.

Instructions for the operating system, applications, and/or programs may be located in storage devices 316, which are in communication with processor unit 304 through communications fabric 302. In these illustrative examples, the instructions are in a functional form on persistent storage 308. These instructions may be loaded into memory 306 for execution by processor unit 304. The processes of the different embodiments may be performed by processor unit 304 using computer implemented instructions, which may be located in a memory such as memory 306.

These instructions are referred to as program code, computer usable program code, or computer readable program code that may be read and executed by a processor in processor unit 304. The program code in the different embodiments may be embodied on different physical or computer readable storage media such as memory 306 or persistent storage 308.

Program code 318 is located in a functional form on computer readable media 320 that is selectively removable and may be loaded onto or transferred to data processing system 300 for execution by processor unit 304. Program code 318 and computer readable media 320 form computer program product 322 in these examples. In one example, computer readable media 320 may be computer readable storage medium 324 or computer readable signal medium 326. Computer readable storage medium 324 may include, for example, an optical or magnetic disc that is inserted or placed into a drive or other device that is part of persistent storage 308 for transfer onto a storage device, such as a hard drive that is part of persistent storage 308. Computer readable storage medium 324 also may take the form of a persistent storage, such as a hard drive, a thumb drive, or a flash memory that is connected to data processing system 300. In some instances, computer readable storage medium 324 may not be removable from data processing system 300. In these illustrative examples, computer readable storage medium 324 is a non-transitory computer readable storage medium.

Alternatively, program code 318 may be transferred to data processing system 300 using computer readable signal medium 326. Computer readable signal medium 326 may be, for example, a propagated data signal containing program code 318. For example, computer readable signal medium 326 may be an electro-magnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 318 may be downloaded over a network to persistent storage 308 from another device or data processing system through computer readable signal medium 326 for use within data processing system 300. For instance, program code stored in a computer readable storage medium in a server data processing system may be downloaded over a network from the server to data processing system 300. The data processing system providing program code 318 may be a server computer, a client computer, or some other device capable of storing and transmitting program code 318.

The different components illustrated for data processing system 300 are not meant to provide architectural limitations to the manner in which different embodiments may be implemented. The different illustrative embodiments may be implemented in a data processing system including components in addition to or in place of those illustrated for data processing system 300. Other components shown in FIG. 3 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 300 is any hardware apparatus that may store data. Memory 306, persistent storage 308, and computer readable media 320 are examples of storage devices in a tangible form.

In another example, a bus system may be used to implement communications fabric 302 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 306 or a cache, such as a cache found in an interface and memory controller hub that may be present in communications fabric 302.

The different advantageous embodiments recognize and take into account a number of different considerations. For example, the different advantageous embodiments recognize that aircraft commonly have a number of networks. The number of networks take the form of different physical media. For example, the aircraft may be equipped with two Ethernet networks, a controller area network (CAN) bus network, and a discrete signal network. Each network may be used for a different purpose. For example, a CAN bus network may be used to monitor the health of oxygen distribution systems. Components of the oxygen distribution systems are located in passenger service units (PSUs). The passenger service units are located above each row of passenger seats on the aircraft.

The different advantageous embodiments also recognize and take into account that the passenger service units above each row of passenger seats may be moved and/or reconfigured during the operational life of the aircraft. For example, the passenger service units may be moved when a new seating plan is used in the aircraft. In other words, a new seating plan changes the pitch between seats. The pitch is the space between seats in a column. The seating plan may be changed to allow for more seats to be installed in the aircraft. Alternatively, the seating plan may be changed to allow for each seat to be surrounded by additional space. Passenger service units may be connected to the networks in the aircraft using a number of wires.

The different advantageous embodiments recognize and take into account that the number of wires may not have extra wire to allow a connection to the passenger service panel to be moved without reworking the number of wires and/or the connection to the passenger service panel. In some examples, a new connector must be designed and/or wires must be rerun from another location. Reworking the wiring in the aircraft is disadvantageous because this process increases the cost of changing the seat plan on the aircraft. Alternatively, additional wire may be installed during the initial configuration of the aircraft. Installing additional wire during initial configuration of the aircraft is disadvantageous, however, because the extra cable adds weight to the aircraft and decreases fuel economy.

The different advantageous embodiments also recognize and take into account that wireless communication between the passenger service units and the networks on the aircraft allow the passenger service units to be moved during a seat plan change without reworking wiring and/or connectors.

Figure 4:
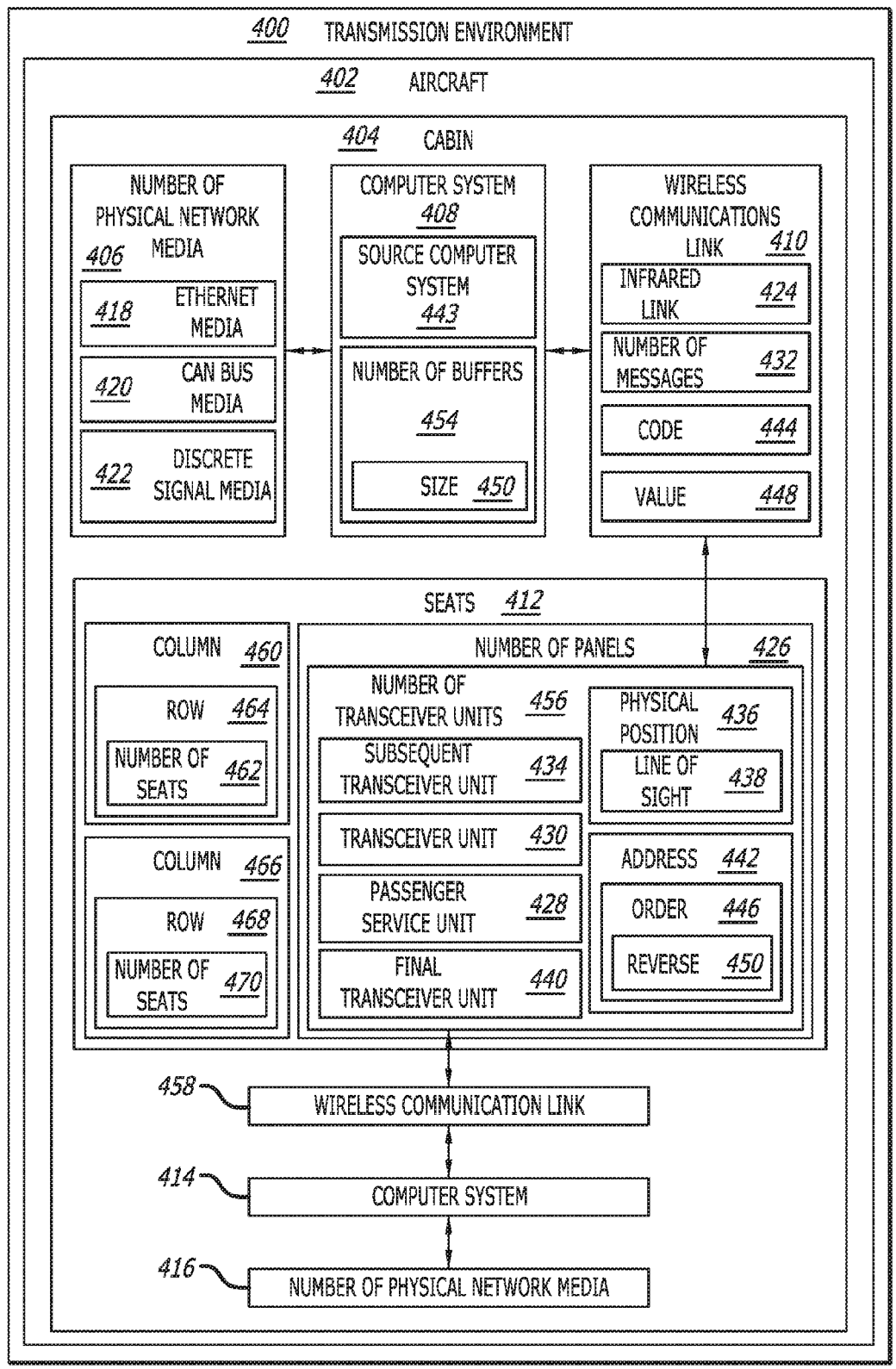
FIG. 4 is an illustration of a block diagram of a transmission environment depicted in accordance with at least one embodiment of the present disclosure.

Turning now to FIG. 4, an illustration of a transmission environment is depicted in accordance with an advantageous embodiment. Transmission environment 400 may be implemented in aircraft 200 in FIG. 2.

In these examples, transmission environment 400 includes aircraft 402. Of course, transmission environment 400 may also contain other vehicles or locations that contain networks. For example, transmission environment may comprise a building and/or an automobile.

Aircraft 402 is discussed in these examples. However, aircraft 402 is a non-limiting example of a vehicle in accordance with an advantageous embodiment. Other vehicles may be used in addition to or in place of aircraft 402. A vehicle, as used herein, is a device used for transporting people and/or objects. For example, the vehicle may be a terrestrial vehicle (e.g., a bus and a train), a marine vehicle (e.g., a boat and a ship), an airborne vehicle (e.g., a spacecraft), or any other suitable vehicle that has seats configured in rows and/or columns.

Cabin 404 is present within aircraft 402. Cabin 404 is an area suitable for humans or objects to be present during operation of the aircraft. Cabin 404 consists of any combination of a passenger cabin, a cockpit, and a cargo bay. In this advantageous embodiment, cabin 404 contains number of physical network media 406, computer system 408, wireless communications link 410, seats 412, computer system 414, and number of physical network media 416.

Number of physical network media 406 make up a number of networks present in cabin 404. The networks are used for communications between systems onboard aircraft 402. In these examples, number of physical network media 406 comprise Ethernet media 418, CAN bus media 420, and discrete signal media 422. CAN bus media is a controller area network bus. Discrete signal media 422 is a media on which a voltage on the media is varied such that the changes in voltage are recognized by devices on discrete signal media 422. Of course, number of physical network media 406 may consist of additional and/or different types of media.

Number of physical network media 406 are connected to computer system 408. Computer system 408 is a data processing system. Computer system 408 may be an example implementation of data processing system 300 from FIG. 3. Of course, some components from data processing system 300 may not be present in computer system 408 and/or additional components may be present in computer system 408. Computer system 408 is configured to send and receive data using wireless communications link 410.

Wireless communications link 410 is a substance through which signals can travel. Wireless communications link 410 is a part of a network. In these examples, however, wireless communications link 410 is a different type of media than number of physical network media 406. For example, number of physical network media 406 may comprise Ethernet media 418, CAN bus media 420, and discrete signal media 422, while wireless communications link 410 is infrared link 424. Number of panels 426 are associated with seats 412.

A first component is considered to be associated with a second component by being secured to the second component, bonded to the second component, fastened to the second component, and/or connected to the second component in some other suitable manner. The first component also may be connected to the second component through using a third component. The first component is also considered to be associated with the second component by being formed as part of and/or an extension of the second component.

In these examples, seats 412 are positioned in rows, such as row 464. Row 464 contains number of seats 462. Number of panels 426 are located above number of seats 462 such that a panel corresponds to number of seats 462 associated with the panel. Row 464 is a part of column 460. Column 460 and column 466 each consist of rows of seats, such as row 464 and row 468, respectively. Column 460 is separated from another column, such as column 466, by a walkway or aisle. Additional columns may be present in cabin 404.

In other words, column 460 contains row 464. Row 464 contains number of seats 462. Number of seats 462 are associated with a panel in number of panels 426. Thus, in some advantageous embodiments, row 464 may be associated with more than one panel in number of panels 426.

Likewise, column 466 contains row 468. Row 468 contains number of seats 470. Number of seats 470 are associated with a panel in number of panels 426. Thus, in some advantageous embodiments, row 468 may be associated with more than one panel in number of panels 426.

In these examples, each panel in number of panels 426 is a passenger service unit 428. A passenger service unit is a device that provides a number of services to a number of passengers sitting in number of seats 462. For example, passenger service unit 428 may provide a switchable reading light, an attendant calling function, in-flight entertainment, notification signage (e.g., no smoking signage, fasten seatbelt signage, and lavatory availability signage), internet connectivity, ventilation, and/or oxygen distribution through a mask.

Number of panels 426 are associated with number of transceiver units 456. In one advantageous embodiment, each panel is associated with one transceiver unit 430 in number of transceiver units 456. Number of transceiver units 456 are devices configured to receive and transmit messages on wireless communications link 410. In these examples, wireless communications link 410 is infrared link 424. In some advantageous embodiments, number of transceiver units 456 are computer systems, like computer system 408 and/or data processing system 300 in FIG. 3. In other advantageous embodiments, number of transceiver units 456 do not contain some components of data processing system 300. For example, number of transceiver units 456 may or may not contain storage devices 316 as in FIG. 3.

Computer system 414 is a computer system like computer system 408. Computer system 414 is connected to number of transceiver units 456 using wireless communications link 458. Computer system 414 is also connected to number of physical network media 416. In these examples, number of physical network media 416 are the same media as number of physical network media 406. However, in other advantageous embodiments, number of physical network media 416 may be different types of media than number of physical network media 406.

Transmission environment 400 may be used to transmit and receive data across the different networks and media contained in transmission environment 400. Number of messages 432 are a number of data communications. The number of data communications may be transmitted across number of physical network media 406 to reach computer system 408, or may be originally transmitted by computer system 408.

Computer system 408 either receives data from other devices on number of physical network media 406 or computer system 408 may create number of messages 432 for transmission. In advantageous embodiments in which data is received on number of physical network media 406, computer system 408 combines the data into number of messages 432. Computer system 408 may combine the data into number of messages 432 by multiplexing the data for transmission on wireless communications link 410. The data may be intended for a number of different devices on the various networks made up of number of physical network media 406.

Computer system 408 then transmits number of messages 432 to number of transceiver units 456 using wireless communications link 410. Computer system 408 transmits number of messages 432 to number of transceiver units 456 by transmitting an infrared representation of number of messages 432 on infrared link 424. A transceiver unit, such as transceiver unit 430, receives number of messages 432. The transceiver unit that receives number of messages 432 then transmits number of messages 432 to subsequent transceiver unit 434.

In these examples, number of transceiver units 456 are configured to send and receive a number of messages 432 to and from each other and computer systems 408 and 414. In one advantageous embodiment, number of transceiver units 456 are positioned in physical position 436 relative to each other. In other words, subsequent transceiver unit 434 is identified by the transceiver unit that most recently received number of messages 432.

In this advantageous embodiment, physical position relative to each other means that each transceiver unit in number of transceiver units 428 is within line of sight 438 of subsequent transceiver unit 434. In this advantageous embodiment, number of transceiver units 428 form a column and each of number of transceiver units 456 receives number of messages 432 from one direction in the column and transmits number of messages 432 to subsequent transceiver unit 434 in the column. Subsequent transceiver unit 434 then transmits number of messages 432 to another subsequent transceiver unit 434 using line of sight 438 in the column of number of transceiver units 456. In these examples, another subsequent transceiver unit 434 is associated with another panel in number of panels 426. Number of transceiver units 456 may comprise two transceivers, with each transceiver directed opposite the other transceiver.

Number of messages 432 is transmitted and received by number of transceiver units 456 from the end of the column closest to computer system 408 to the end of the column farthest from computer system 408. Final transceiver unit 440 receives number of messages 432 once all other transceiver units in number of transceiver units 456 have received number of messages 432. In other words, final transceiver unit 440 is identified as the last transceiver unit in number of transceiver units 456 to receive number of messages 432 from another transceiver unit.

Final transceiver unit 440 then transmits messages 432 to computer system 414 using wireless communications link 458. Wireless communications link 458 may be of the same type as wireless communications link 410. In these examples, wireless communications link 458 is an infrared link. Once computer system 414 receives number of messages 432 from final transceiver unit 440, computer system 414 decodes number of messages 432. Computer system 414 then recreates the original messages that composed number of messages 432 on the corresponding media in number of physical network media 416. In these advantageous embodiments, computer system 414 recreates the data from number of messages 432 on a medium in number of physical network media 416 that matches the medium on which the data was received at computer system 408 on number of physical network media 406. For example, if data from Ethernet media 418 was contained in number of messages 432, computer system 408 recreates the data on an Ethernet medium in number of physical network media 416. Computer system 408 may encode an identifier for number of physical network media 406 on which the data was received.

In some advantageous embodiments, number of messages 432 also contains data intended for receipt and/or processing by transceiver unit 430. In such an advantageous embodiment, each of the number of transceiver units 456 are addressed with address 442. Address 442 is assigned to transceiver unit 430 and is unique among number of transceiver units 456. To assign address 442 to each of number of transceiver units 456, source computer system 443 transmits code 444. Source computer system 443 is a computer system configured to generate code 444. In some advantageous embodiments, source computer system 443 is computer system 408. Code 444 may contain information recognized by number of transceiver units to be coded to identify address 442.

Code 444 is transmitted among number of transceiver units 456 in the same manner as number of messages 432. In other words, code 444 is received by transceiver unit 430 and transmitted to subsequent transceiver unit 434 in order 446. Order 446 is the sequence in which number of transceiver units 456 have line of sight 438 with one another. Code 444 is transmitted along order 446 until final transceiver unit 440 receives code 444.

When code 444 is received by final transceiver unit 440, final transceiver unit 440 transmits value 448 in reverse 450 of order 446. In other words, value 448 is transmitted and received by number of transceiver units 456 in inverted order 446. Each transceiver unit 430 in number of transceiver units 456 modifies value 448 and transmits modified value 448 to the next transceiver unit 430 in reverse 450 of order 446. In one advantageous embodiment, final transceiver unit 440 transmits value 448 of "1" and each transceiver unit 430 increments value 448 by one. Once the first transceiver unit 430 to receive code 444 receives value 448, value 448 is transmitted to computer system 408. Each transceiver unit 430 stores address 442 for transceiver unit 430. Source computer system 443 sets size 452 of number of buffers 454 to value 448. Number of buffers 454 store number of messages 432 prior to transmitting by computer system 408 and/or while wireless communications link 410 is in use by transceiver unit 430 or computer system 414.

The illustration of aircraft 402 in transmission environment 400 is not meant to imply physical or architectural limitations to the manner in which different features may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, additional computer systems 414 may be located between transceiver units 430 in number of transceiver units 456. Computer system 414 may also set size 452 of buffers 454 using value 448. In such an advantageous embodiment, computer system 408 may send value 448 to computer system 414 on wireless communications link 410 through number of transceiver units 456.

Figure 5:
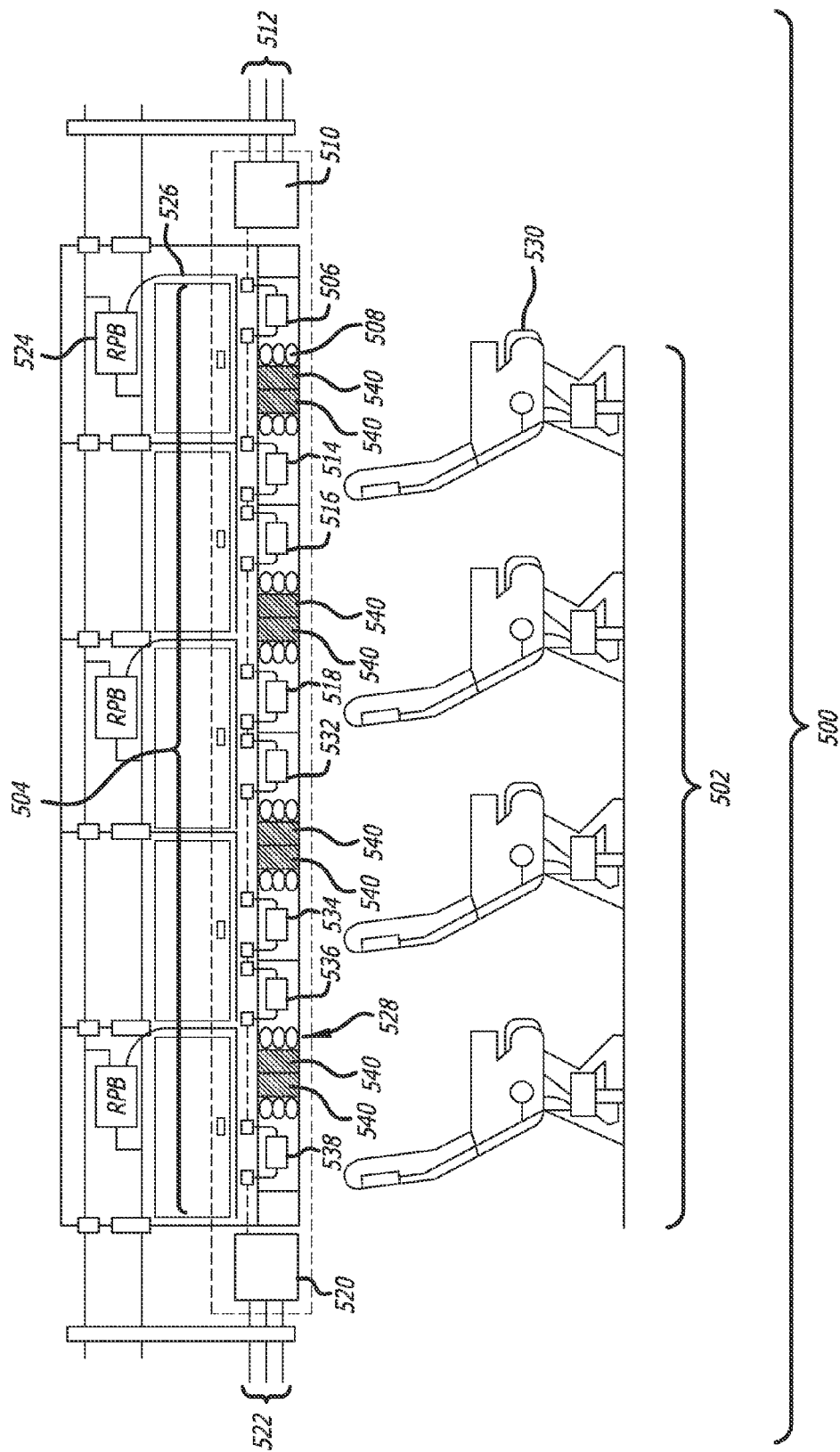
FIG. 5 is an illustration of an aircraft cabin depicted in accordance with at least one embodiment of the present disclosure.

Turning now to FIG. 5, an illustration of an aircraft cabin is depicted in accordance with an advantageous embodiment. Cabin 500 is an example implementation of cabin 404 in FIG. 4. Cabin 500 contains seats 502. Seats 502 are an example implementation of column 460 within seats 412 in FIG. 4.

Cabin 500 also contains passenger service units 504. Number of passenger service units 504 are example implementations of passenger service unit 428 in FIG. 4. In this advantageous embodiment, each seat in seats 502 is associated with one or more passenger service unit in number of passenger service units 504.

In this advantageous embodiment, each seat is associated with two passenger service units. A passenger service unit is associated with a seat when the passenger service unit provides a number of services for the seat and/or a passenger sitting in the seat. For example, both passenger service unit 506 and passenger service unit 514 are associated with seat 530. In the depicted example, passenger service units 506, 516, 532, and 536 communicate with and operate lighting elements for the seats, and passenger service units 514, 518, 534, and 538 communicate with and operate oxygen deployment systems.

In these examples, a passenger service unit, such as passenger service unit 506, is located within a panel such as panel 508. Panel 508 is an example implementation of a panel in number of panels 426. In the depicted example, panel 508 is associated with seat 530. However, panel 508 may also be associated with other seats in the same row as seat 530 that are not depicted in this illustration.

Also in these examples, blank panels 540 are shown to be located above the seats 502. These blank panels 540 are installed next to the panels 508, which are associated with the passenger service units 504. The blank panels 540 are removable, and can each be replaced with a test interface panel (TIP) (e.g., refer to the test interface panel 600 in FIGS. 6A-C) for testing of the passenger service units 504. The description of FIGS. 6D and 7 discusses how test interface panels (TIPs) can be used to test the passenger service units 504.

In this depicted example, messages arrive at computer system 510 on media 512. Computer system 510 is an example implementation of computer system 408 and media 512 are example implementations of number of physical network media 406 in FIG. 4. In these illustrative examples, computer system 510 has an infrared transceiver. Computer system 510 combines the messages from the different media 512 and uses the infrared transceiver to wirelessly transmit the messages to passenger service unit 506.

In the illustrative examples, passenger service unit 506 receives the messages and transmits the messages to passenger service unit 514. Passenger service unit 506 may receive the messages on a first infrared transceiver directed toward computer system 510 to include the line of sight with computer system 510. Passenger service unit 506 may use a second transceiver directed toward passenger service unit 514 to transmit the messages to passenger service unit 514. Passenger service unit 506 may be connected to an electrical power distribution system (i.e. a rail power box (RPB)) 524 using wire 526. In the depicted example, wire(s) 526 provides electrical power for all of number of passenger service units 504. In one or more embodiments, a power rail(s) (e.g., refer to the passenger service unit mounting rail 806 in FIG. 8) is employed for the wire(s) 526. Refer to the description of FIG. 8 for a detailed discussion of an exemplary power rail (e.g., the passenger service unit mounting rail 806) that may be employed by the disclosed system.

Referring back to FIG. 5, passenger service unit 514 receives the messages and transmits the messages to passenger service unit 516. Passenger service unit 516 receives the messages and transmits the messages to passenger service unit 518. Passenger service unit 518 receives the messages and transmits the messages to passenger service unit 532. Passenger service unit 532 receives the messages and transmits the messages to passenger service unit 534. Passenger service unit 534 receives the messages and transmits the messages to passenger service unit 536. Passenger service unit 536 receives the messages and transmits the messages to passenger service unit 538. Passenger service unit 538 receives the messages and transmits the messages to computer system 520.

In response to receiving the messages, computer system 520 decodes the messages and uses information in the messages to identify the type of media on which the message was received. Computer system 520 recreates messages on number of physical media 522 such that the messages are transmitted on the same type of physical media on which they were received. In some advantageous embodiments, multiple physical media of the same type are present. In such advantageous embodiments, an additional identifier may be encoded in the messages to identify the networks on which the messages were received.

FIG. 6A is a side view of a disclosed test interface panel 600, in accordance with at least one embodiment of the present disclosure. A test interface panel (TIP) 600 is a specifically designed piece of test equipment attached to a standard four-inch blank panel that can be inserted on the power rails between passenger service unit panels 508 (refer to FIG. 5) to provide complete access to the data bus and power bus for active testing and modification.

In FIG. 6A, a test interface panel 600 is shown to include a processor and control card 630, which contains at least one processor. In addition, the test interface panel 600 includes an interface connector (e.g., a USB Type B connector or a USB Type Micro-B connector) 610 that can be used to connect the test interface panel 600 to a user interface (not shown). The test interface panel 600 is shown to be connected to two power rails 620 (e.g., refer to wire(s) 526 in FIG. 5), which are used to power the processor and control card 630 of the test interface panel 600. It should be noted that the power rails 620 are not part of the test interface panel 600, but rather are part of the passenger service unit infrastructure in the cabin 500 of the aircraft (refer to wire(s) 526 in FIG. 5).

FIG. 6B is a front view of the test interface panel 600 of FIG. 6A, in accordance with at least one embodiment of the present disclosure. This figure shows another view of the test interface panel 600 better illustrating the interface connector 610.

FIG. 6C is a back view of the test interface panel 600 of FIG. 6A, in accordance with at least one embodiment of the present disclosure. In this figure, the test interface panel 600 is shown to include power rail connectors 650, which are used to connect the test interface panel to the power rails 620 (refer to FIG. 6A) to power the processor and control card 630. Also, in FIG. 6C, the test interface panel 600 is shown to include two infrared (IR) interfaces (I/Fs) 640. The IR I/Fs 640 are used by the processor and control card 630 of the test interface panel 600 to communicate with the passenger service unit(s) being tested. It should be noted that in one or more embodiments, various other interfaces may be used other than IR interfaces for the test interface panel 600 to be able to communicate with the passenger service unit(s). Types of interfaces that may be employed include, but are not limited to, radio frequency (RF) interfaces and electrical cable (e.g., RS-485) interfaces.

FIG. 6D is an illustration of a passenger service unit 504 being tested by a user interface 690 via the test interface panel 600 of FIGS. 6A-C in an aircraft cabin 500, in accordance with at least one embodiment of the present disclosure. In this figure, a test interface panel 600 is shown to be installed next to a passenger service unit panel 504 that is associated with a passenger service unit (not shown) to be tested and/or configured. The test interface panel 600 is installed such that it is connected to a power source (e.g., a power rail(s)) and is able to communicate (e.g., via IR) with the passenger service unit. In this example, the passenger service unit provides ventilation function 660 and lighting function 670 to at least one passenger seat 502 situated below its associated passenger service unit panel 504.

In order to perform the testing and/or configuration of the passenger service unit, a user interface 690 is used. Test software resides on the user interface 690 that provides a means for monitoring, probing, testing, and changing data in real time on the communication bus (e.g., IR and/or RS-485 data buses) at the word, byte, and/or bit level; and provides a means for monitoring the health and condition of the communication data bus as well as the power rail voltages and state. In addition, the test software allows for the user interface 690 to display the current passenger service unit IR data bus traffic and status, to display the current passenger service unit RS-485 data bus traffic and status, to display the current power rail power configuration, to view individual data command packets (e.g., in decoded, binary, and/or Hex formats), to perform real-time modification of command data packets (e.g., to modify the command, status bits, and/or the data) at the bit level, to perform real-time command and data packet insertion, to invoke a passenger service unit bus traffic simulator (used to simulate a passenger service unit's function during testing and troubleshooting), and to vary bus traffic timing.

For the testing/configuration of a passenger service unit, a user first connects the user interface 690 (e.g., a tablet computer, a laptop computer, or a smart phone) to the test interface panel 600. The user interface 690 may be connected to the test interface panel 600 by wire 680 to the interface connector 610 on the test interface panel 600. It should be noted that in alternative embodiments, the user interface 690 may be connected to the test interface panel 600 wirelessly (not shown) (e.g., by Wi-Fi or by Bluetooth). After the user interface 690 is connected to the test interface panel 600, the user interface 690, utilizing the resident test software, sends at least one command to the passenger service unit via the test interface panel 600. In one or more embodiments, the command may be a test command (e.g., a command to test whether the light turns on or off) or a configuration command (e.g., to set a specific state for the power rail). In addition, in some embodiments, the test command may be a verification command (e.g., to determine the specific state that has been previously set for a unit) or a troubleshooting command. After the passenger service unit receives the command, the passenger service unit sends at least one response. The response may be a signal response (e.g., a response that is sent to the user interface 690 via the test interface panel 600 and is subsequently displayed on the user interface 690) and/or may be a physical response (e.g., a physical turning on or off of a light).

Figure 7:
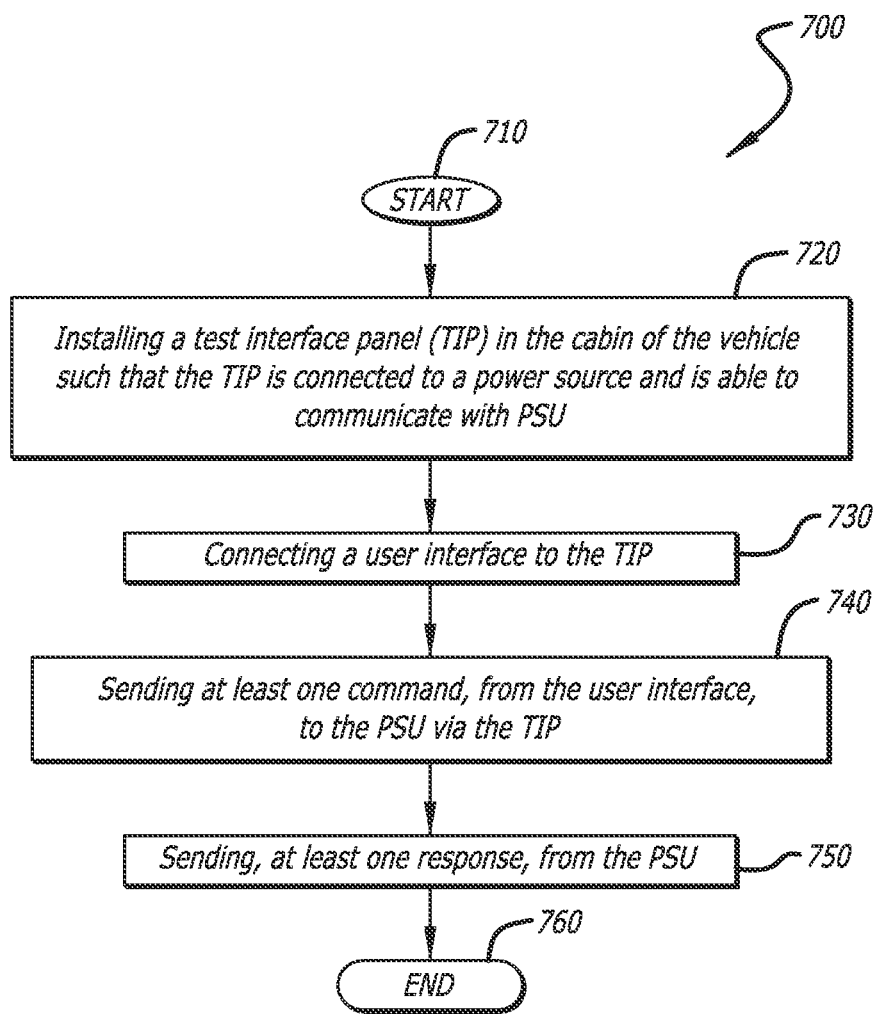
FIG. 7 is a flow chart for the disclosed method for testing a passenger service unit (PSU) of a cabin of a vehicle, in accordance with at least one embodiment of the present disclosure.

FIG. 7 is a flow chart for the disclosed method 700 for testing a passenger service unit (PSU) of a cabin of a vehicle, in accordance with at least one embodiment of the present disclosure. At the start 710 of this method 700, a test interface panel (TIP) is installed in the cabin of a vehicle such that the TIP is connected to a power source and is able to communicate with the PSU 720. A user interface is connected to the TIP 730. Then, the user interface sends at least one command to the PSU via the TIP 740. At least one response is then sent from the PSU 750. Then, the method 700 ends 760.

Figure 8:
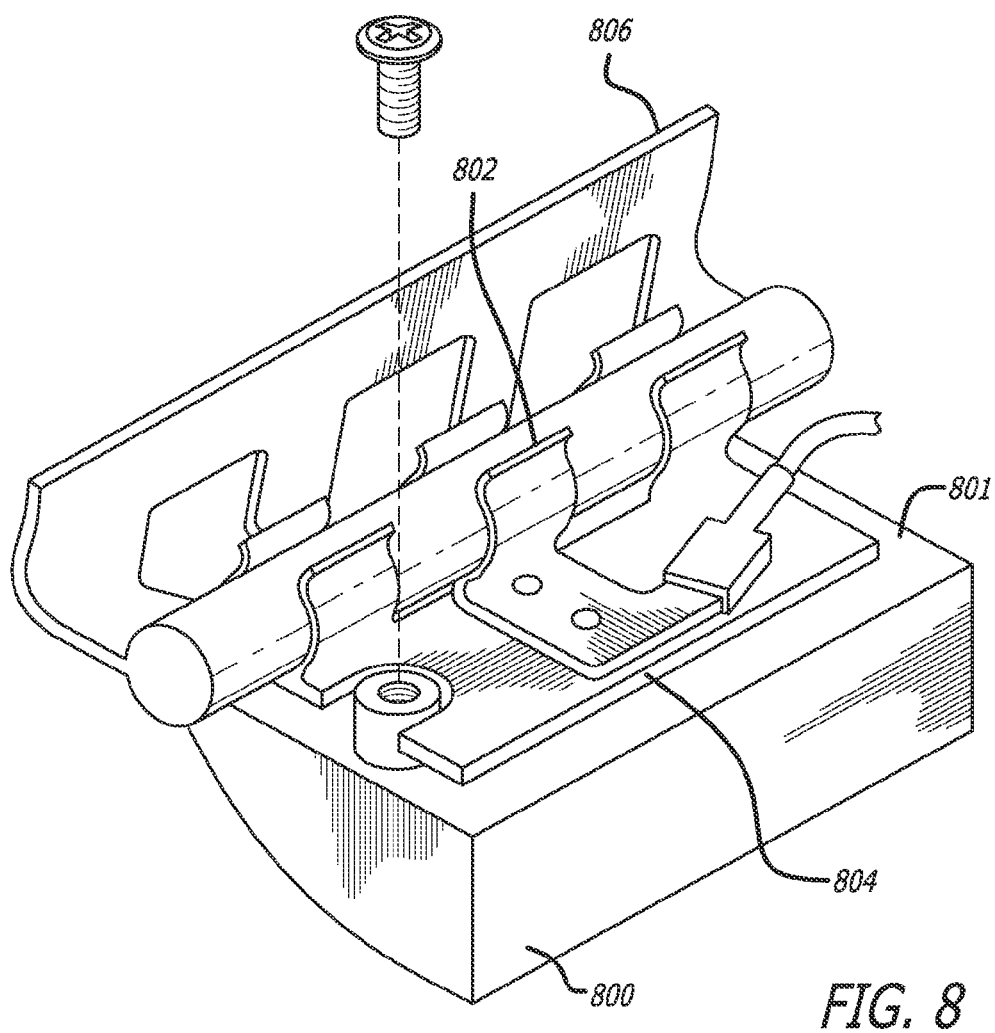
FIG. 8 is a perspective view of a portion of a passenger service unit module, in accordance with at least one embodiment of the present disclosure.

FIG. 8 is a perspective view of a portion of the passenger service unit module (i.e. a SPSU module) 800. The portion of the passenger service unit module 800 illustrated in FIG. 8 shows an electrical contact assembly 801. The assembly 801 may comprise an electrical spring contact 802 and a plastic, non-conductive, insulating support 804. The electrical spring contact 802 may be made of, for example, beryllium copper that is nickel and gold plated. The electrical spring contact 802 may be designed to clip onto the round portion of electrically conductive passenger service unit mounting rail (e.g., a power rail) 806. The plastic support 804 may be also designed to clip onto the passenger service unit mounting rail 806 and may be intended to support the electrical spring contact 802 and to prevent the electrical spring contact 802 from rocking back and forth on the passenger service unit mounting rail 806. The electrical contact assembly 801 may be loosely fastened to a passenger service unit module such that when a passenger service unit module vibrates under the passenger service unit mounting rail 806, the electrical spring contact 802 will float over the passenger service unit module and maintain its grip on the passenger service unit mounting rail 806. With these elements in place, the electrical spring contact 802 may mate with the electrically conductive portion of the passenger service unit mounting rail 306 when the passenger service unit is installed and held in place by the passenger service unit catches (not shown).

Accordingly, each passenger service unit module 800 may receive electrical power from the mounting rail 806 via its electrical spring contacts 802.

Passenger service unit mounting rails may be typically constructed from an aluminum extrusion that is approximately the same length as the stow bin assembly. In this embodiment, the mounting rails may have the following features. Each rail may be electrically connected to one of the outputs from the simplified overhead electronics unit 406 via a wire. Thus, one rail may be connected to the normally positive DC output and the other rail may be connected to the normally negative DC output. The edge of the rail that passenger service unit module clips may attach to is kept electrically conductive. While most surfaces of the rail are typically primed and painted, the aluminum rail along this edge may be plated, for example, with nickel and gold to provide electrical conduction.

Note that the simplified overhead electronics unit above may energize these rails with 12 VDC voltage. It should be noted that in other embodiments, a voltage other than 12 VDC may be utilized.

In a system and method in accordance with the present embodiment, the passenger service unit mounting rails may perform two functions: (1) mechanical support of the passenger service unit modules; and (2) electrical supply to the passenger service unit modules.

This may minimize the addition of new components or weight to the airplane. However, because of this dual functionality, electrical isolation may be required between the rail and any adjacent conductive airplane parts. Thus, plastic bushings may likely be used at the rail mounting points.

When combined with a wireless data infrastructure, the mounting rails may greatly simplifies the passenger service unit installation by providing electrical power to passenger service unit modules via the passenger service unit mounting rails instead of through electrical wiring. With no data or power wiring interfaces, passenger service unit modules may be able to be installed, removed or relocated much more rapidly.

It should be noted that in one or more embodiments, the passenger service unit mounting rail (e.g., a power rail) 806 may be implemented by various different means other than an aluminum extrusion. For example, the passenger service unit mounting rail (e.g., a power rail) 806 may be implemented by printed circuit boards or by a conventional wire(s).

Figure 9A:
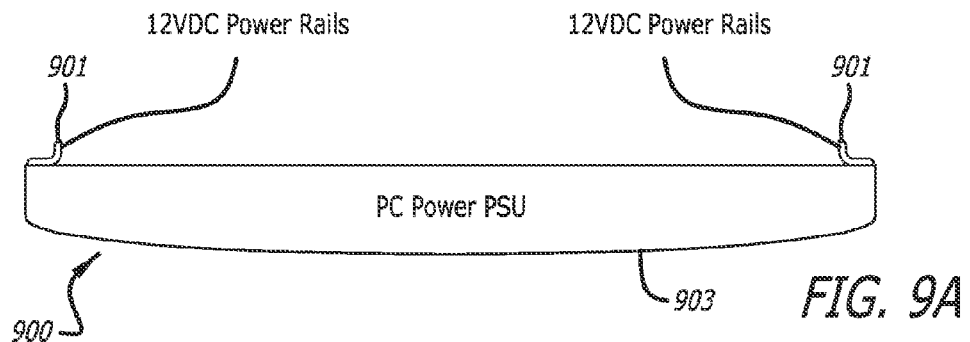
FIG. 9A is a view of an embodiment of a power system, in accordance with at least one embodiment of the present disclosure.

FIG. 9A is a view of one embodiment of a power system 900. In this system, a power panel may be mounted on structural bin rails that double as power rails 901. The rails 901 provide power to the power module unit 904. Current limiting and short circuit protection may be provided by a power module unit power supply.

Figure 9B:
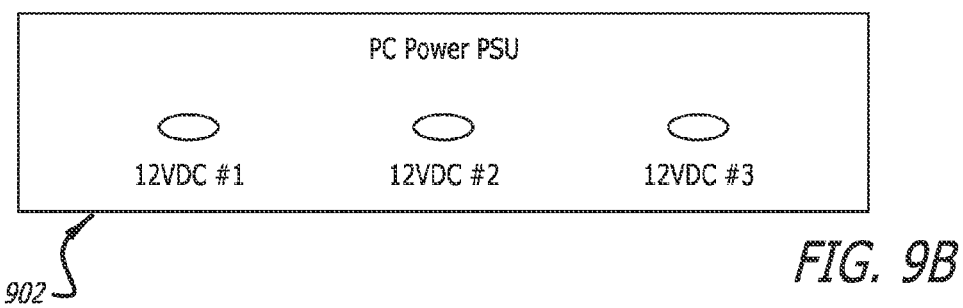
FIG. 9B is a block diagram of one embodiment of a power module unit, in accordance with at least one embodiment of the present disclosure.

FIG. 9B is a block diagram of one embodiment of a power module unit 902. FIG. 10A is a detailed view of the power module unit 902 shown in FIG. 9B.

Referring to FIG. 10A, power supply 906a may provide power conditioning to the three power outlets 908a-c limiting the current sourced to each outlet to a predetermined current such as 1.5 A. In this embodiment, the three power outlets may provide 12 VDC.

Figure 9C:
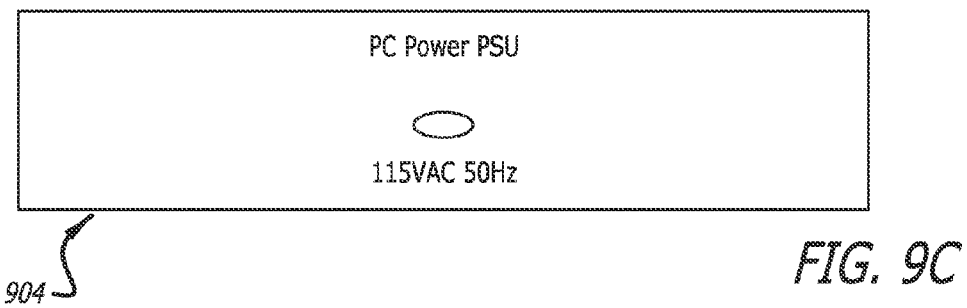
FIG. 9C is a block diagram of another embodiment of a power module unit, in accordance with at least one embodiment of the present disclosure.

FIG. 9C is a block diagram of another embodiment of a power module unit 904. FIG. 10B is a detailed view of the power module 904.

Referring to FIG. 10B, the power supply 906b may provide power to a power outlets 910 limiting the current source to a predetermined current such as 1.5 A. In this embodiment, the power supply may provide power conditioning and 60 HZ power inversion to provide a standard 115 VAC power outlet.

In both FIGS. 10A and 10B, the passenger service unit power supply may obtain their power from the powered rails. That power is then conditioned by the passenger service unit power supply 906a and 906b and distributed to the individual automotive or defined power connectors. Accordingly, the power supply may provide power to an accessory portable device on the aircraft such as a laptop computer, notebook computer, personal digital assistant, portable phone, MP3 player, IPOD or the like.

Figure 11:
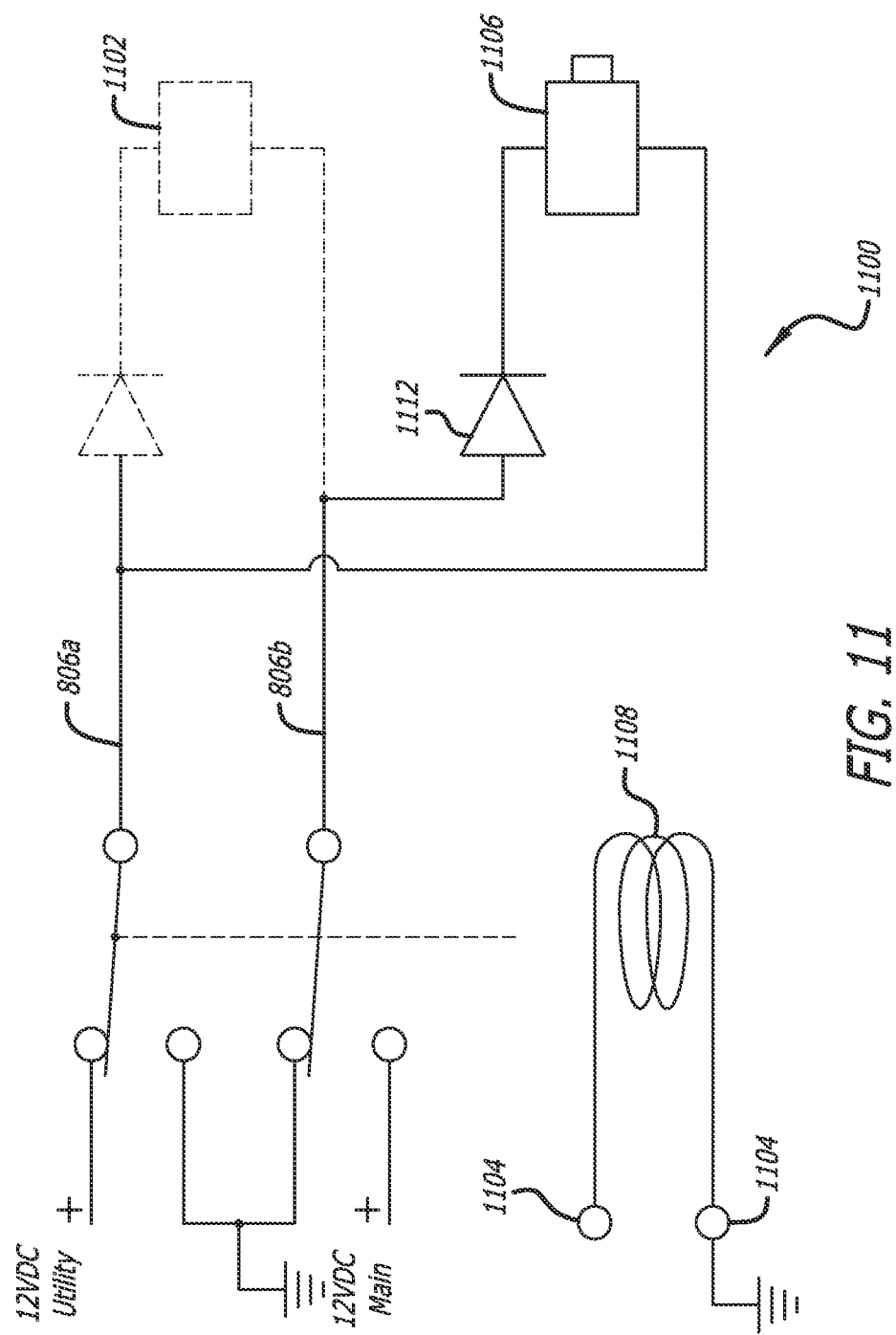
FIG. 11 is a block diagram of the embodiment of a power switching system for use with the power module unit.

FIG. 11 is a block diagram of the embodiment of a power switching system 1100 for use with a power module unit 1102 in accordance with a number of embodiments. The power switching system 1100 may utilize a relay 1108 (either a mechanical or a solid state). Since the power module unit 1102 may share the power rails 806a-806b with the oxygen passenger service unit (not shown), each power module unit 1102 may be protected by diode 1112 to prevent power from being applied to the power system 1102 while oxygen may be deployed. Diode 1112 also assures that the test interface panels (TIPs) (not shown), which are powered by the power rails 806a-806b, will not be incorrectly powered.

In this system, the power rails 806a-806b may also double as the oxygen mask deploy wiring. The oxygen deploy discrete output 1104 may be tied to the relay coil 1108. When oxygen is commanded, the relay 1108 may be energized and 12 VDC power from the primary bus may be routed to the power rails 806a-806b in reverse polarity causing the oxygen passenger service unit door solenoid 1106 to be energized causing the oxygen masks (not shown) to deploy. The diode 1112 in the power module unit 1102 may keep the power system off until utility bus power is restored and the oxygen discrete is returned to its normal state. The details of one embodiment of an oxygen deployment system are described, for example, in U.S. Pat. No. 7,597,286, entitled "Simplified Power System for a Cabin Services System for an Aircraft", filed on Dec. 16, 2005, issued on Oct. 6, 2009, assigned to the assignee of the present disclosure, and incorporated by reference herein.

The flowchart and block diagrams in the different depicted embodiments illustrate the architecture, functionality, and operation of some possible implementations of systems and methods in different advantageous embodiments. In this regard, each block in the flowchart or block diagrams may represent a module, segment, function, and/or a portion of an operation or step.

In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the invention. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for testing a passenger service unit (PSU) of a cabin of a vehicle, the method comprising:
   installing a test interface panel (TIP), which is not part of the PSU, the cabin of the vehicle such that the TIP is connected to a power source and is able to communicate with the PSU;
   connecting a user interface to the TIP;
   sending at least one command, from the user interface, to the PSU via the TIP; and
   sending, at least one response, from the PSU.

2. The method of claim 1, wherein the vehicle is one of an airborne vehicle, a terrestrial vehicle, and a marine vehicle.

3. The method of claim 2, wherein the airborne vehicle is one of an aircraft and a spacecraft.

4. The method of claim 2, wherein the terrestrial vehicle is one of a bus and a train.

5. The method of claim 2, wherein the marine vehicle is one of a boat and a ship.

6. The method of claim 1, wherein the PSU controls at least one of at least one reading light, an attendant calling function, ventilation, oxygen, an in-flight entertainment system, notification signage, and internet connectivity.

7. The method of claim 1, wherein the TIP is connected to the power source via a power rail in the cabin.

8. The method of claim 1, wherein the TIP is able to communicate with the PSU by one of infra-red, radio frequency (RF), and electrical cable.

9. The method of claim 1, wherein the user interface is connected to the TIP by one of wire and wirelessly.

10. The method of claim 1, wherein the user interface is one of a tablet computer, a laptop computer, and a smart phone.

11. The method of claim 1, wherein the at least one command is one of a test command and a configuration command.

12. The method of claim 11, wherein the test command is one of a verification command and a troubleshooting command.

13. The method of claim 1, wherein the at least one response is at least one of a signal response received by the user interface from the PSU via the TIP and a physical response.

14. A system for testing a passenger service unit (PSU) of a cabin of a vehicle, the system comprising:
   a test interface panel (TIP), which is not part of the PSU, installed in the cabin of the vehicle such that the TIP is connected to a power source and is able to communicate with the PSU;
   a user interface to connect to the TIP and to send at least one command to the PSU via the TIP; and
   the PSU to send at least one response.

15. The system of claim 14, wherein the TIP is connected to the power source via a power rail in the cabin.

16. The system of claim 14, wherein the TIP is able to communicate with the PSU by one of infra-red, radio frequency (RF), and electrical cable.

17. The system of claim 14, wherein the user interface is connected to the TIP by one of wire and wirelessly.

18. The system of claim 14, wherein the user interface is one of a tablet computer, a laptop computer, and a smart phone.

19. The system of claim 14, wherein the at least one response is at least one of a signal response received by the user interface from the PSU via the TIP and a physical response.

20. An apparatus for testing a passenger service unit (PSU) of a cabin of a vehicle, the apparatus comprising:
   a test interface panel (TIP),
   wherein the TIP, which is not part of the PSU, is installed in the cabin of the vehicle such that the TIP is connected to a power source and is able to communicate with the PSU, and
   wherein the TIP is to connect to a user interface, to receive at least one command from the user interface, and to send the at least one command to the PSU.

* * * * *